United States Patent [19]

Tasch, Jr. et al.

[11] 4,384,301

[45] May 17, 1983

[54] HIGH PERFORMANCE SUBMICRON METAL-OXIDE-SEMICONDUCTOR FIELD EFFECT TRANSISTOR DEVICE STRUCTURE

[75] Inventors: Al F. Tasch, Jr.; Pallab K. Chatterjee, both of Richardson, Tex.; Horng-Sen Fu, Sunnyvale, Calif.

[73] Assignee: Texas Instruments Incorporated, Dallas, Tex.

[21] Appl. No.: 310,200

[22] Filed: Oct. 9, 1981

Related U.S. Application Data

[63] Continuation of Ser. No. 92,010, Nov. 7, 1979, abandoned.

[51] Int. Cl.³ .......................................... H01L 29/78
[52] U.S. Cl. ...................................... 357/23; 357/67
[58] Field of Search .............. 357/23 S, 23 C, 23 R, 357/67, 59

[56] References Cited

U.S. PATENT DOCUMENTS

| | | | |
|---|---|---|---|
| 4,085,498 | 4/1978 | Rideout | 357/23 S |
| 4,141,022 | 2/1979 | Sigg | 357/23 |
| 4,319,260 | 3/1982 | Tasch | 357/23 S |

Primary Examiner—Martin H. Edlow
Attorney, Agent, or Firm—Robert Groover, III; Melvin Sharp; James T. Comfort

[57] ABSTRACT

A novel metal-oxide-semiconductor (MOS) field effect transistor having enhanced oxide thickness at the edge of the gate electrode and having metal silicide regions in the gate electrode and source and drain areas. The enhanced oxide thickness improves interconnect-to-interconnect breakdown voltage in multilevel interconnect devices as well as minimizing gate overlap of source and drain. The metal silicide regions reduce series resistance and improve device speed and packing density.

4 Claims, 7 Drawing Figures

HIGH PERFORMANCE SUBMICRON METAL-OXIDE-SEMICONDUCTOR FIELD EFFECT TRANSISTOR DEVICE STRUCTURE

This is a continuation of application Ser. No. 92,010, filed Nov. 7, 1979, now abandoned.

BACKGROUND OF THE INVENTION

This invention is directed to high density metal-oxide-semiconductor devices, and more particularly, to a high density metal-oxide-semiconductor field effect transistor structure having thicker oxide at the gate edges and metal silicide regions in the source, drain and gate.

Since the invention of the integrated circuit there has been a constant effort directed toward increasing the number of components per unit of chip area. This has been done both by improvements in existing technologies and by the invention of new technologies. The first integrated circuits were bipolar in operation and used junction isolation to achieve electrical isolation of individual components. However, the self-isolating metal-oxide-semiconductor devices with their inherently higher packing density have substantially replaced bipolar devices in microprocessors and memories, areas where very high packing density is required. As the demand for faster, higher density metal-oxide-semiconductor devices continues, improvements in fabrication technology are necessary to keep pace with the demand. Today efforts are being made toward increasing device density and speed by decreasing component geometries, junction depths, oxide thicknesses, etc., device speed usually improving as the packing density increases Oxide thickness must be scaled down along with reductions in other parameters but oxide breakdown problems such as interconnect to interconnect breakdown in multilevel interconnect systems arise as the oxides get thinner. Component geometries must obviously decrease if packing density improvements are to be achieved. Junctions depths must be reduced to avoid punch-through from source to drain, and gate overlap of source and drain must be reduced to minimize gate-to-source and gate-to-drain capacitances which reduce device speed. Recent work in that area is shown in copending applications, "METHOD OF FABRICATING SILICON GATE FIELD EFFECT TRANSISTORS IN A MULTILEVEL INTERCONNECT SYSTEM AND STRUCTURE RESULTING THEREFROM," by Al F. Tasch, Jr. and Horng-Sen Fu, Ser. No. 72,803 filed Sept. 5, 1979 and "METAL-OXIDE-SEMICONDUCTOR DEVICES USING METAL SILICIDE REGIONS TO IMPROVE DEVICE SPEED AND PACKING DENSITY", by Al F. Tasch, Jr. and Pallab K. Chatterjee, Ser. No. 92,009, filed 11-7-79. However, as junction depths and component geometries are reduced, the resistance and/or sheet resistance of the resulting component elements (e.g. sources, drains, gate electrodes, etc.) will increase. This becomes a major problem with existing and future designs since long, thin, narrow interconnect strips (e.g. gate electrodes) and long, narrow, shallow doped regions (e.g. sources and drains) are necessary to achieve high density device layouts. As the resistance of the doped regions increases to a certain point, these regions cannot be used for interconnects. This will have a negative impact on device size. Also, the high series resistance of the sources and drains will degrade device performance especially at lower power supply voltages. As the resistance of the polycrystalline gate electrodes increases the RC time constant associated with the electrode will increase and slow down device speed.

SUMMARY OF THE INVENTION

The invention is embodied in a novel metal-oxide-semiconductor field effect transistor having enhanced oxide thickness at the edge of the gate electrode, and having metal silicide regions in the gate electrode and source and drain areas. The oxide at the gate edges is increased by growing or depositing an oxide over the gate electrode, ion implanting the oxide to a specific depth, and etching the oxide in a solution which etches the implanted areas at a higher rate than the unimplanted areas. An alternative non-ion implant method may be used to enhance the oxide at the gate edges. The enhanced oxide thickness increases the breakdown voltage between different levels of interconnections in a multilevel interconnect system device, and also between the gate and the source and drain. The gate overlap of the source and drain is reduced by the thickness of the gate edge oxide. Consequently, gate-to-source and gate-to-drain capacitance is reduced thereby improving device speed. All the metal silicide regions are formed simultaneously by sputtering or evaporating metal upon the device after the source and drain are formed. The device is annealed in a high temperature furnace causing the metal to react with the silicon and form metal silicide. After anneal, the metal not exposed to silicon is removed.

BRIEF DESCRIPTION OF THE DRAWINGS

The novel features believed characteristic of the invention are set forth in the appended claims. The invention itself, however, as well as other features and advantages thereof will be best understood by reference to the detailed description which follows, read in conjunction with the accompanying drawings, wherein:

DETAILED DESCRIPTION OF THE DRAWINGS

Figure 1A:
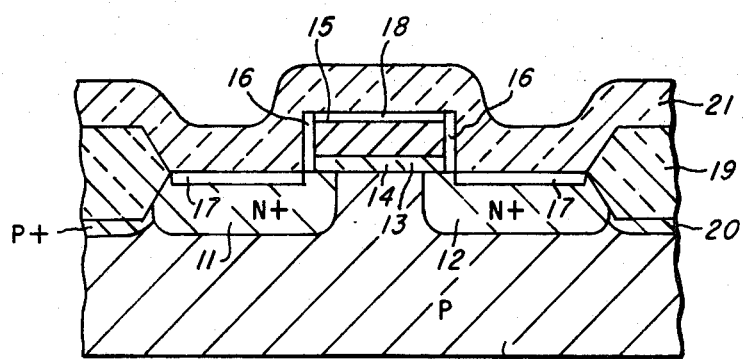
FIGS. 1a–1b are cross-sectional views of an individual MOS transistor showing the feature of the invention.

Referring to FIG. 1, an individual MOS transistor is shown in cross-section. The term metal-oxide-semiconductor (MOS) is defined for purposes of this disclosure as including structures in which an insulator or combination of insulators is sandwiched between a conductor and a semiconductor. This definition will be understood to include structures where polycrystalline silicon is the conductor. The transistor is formed in a substrate 10 of p-type silicon. A pair of doped regions 11, 12 of a conductivity type opposite that of the substrate 10 are formed in surface regions of the substrate 10 and comprise the source 11 and drain 12 respectively. A thin insulating layer 13 of silicon dioxide lies upon the substrate 10 between the source 11 and drain 12 to form the gate dielectric 14 of the transistor. A conductive strip 15 of polycrystalline silicon lies upon the thin insulating layer 13 and forms the gate electrode 15 of the transistor. A pair of insulating regions 16 of silicon dioxide lie upon the substrate 10 surface with each of the insulating regions 16 in contact with an edge of the thin insulating layer 13 and the conductive strip 15. Each insulating region 16 partially overlaps a separate one of the pair of doped regions 11, 12. A metal silicide region 17 of platinum silicide lies in each of the source 11 and drain 12 areas with one edge of each platinum silicide regions 17 lying substantially coincident with an edge of one of the insulating regions 16. A platinum silicide region 18 lies in a surface region of the polycrystalline silicon gate electrode 15. A thick insulating layer 19 (thick field oxide) lies partially above and partially below the surface of the substrate 10 and surrounds the transistor, lying adjacent to an edge of each platinum silicide region 17. Channel stop regions 20 of the same conductivity type as the substrate 10 lie in the substrate 10 beneath the thick field oxide layer 19. An insulating layer 21 comprising silicon dioxide covers the entire device except where apertures are formed for contacts.

Figure 1B:
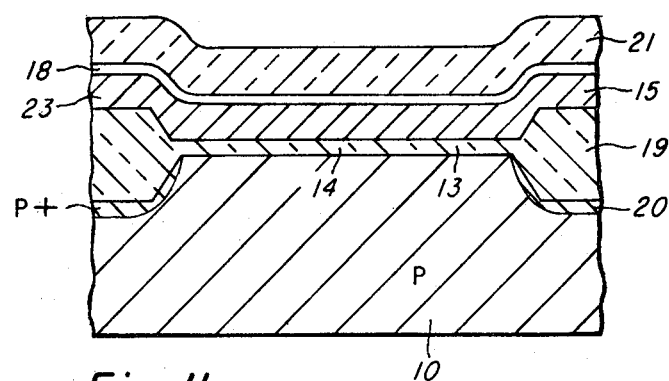
Figure 2A:
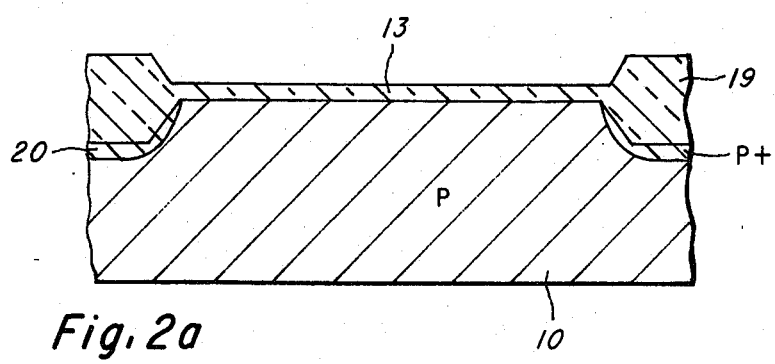
FIGS. 2a–2e are cross-sectional views of the transistor of FIG. 1 at successive stages in the manufacturing process.
Figure 2B:
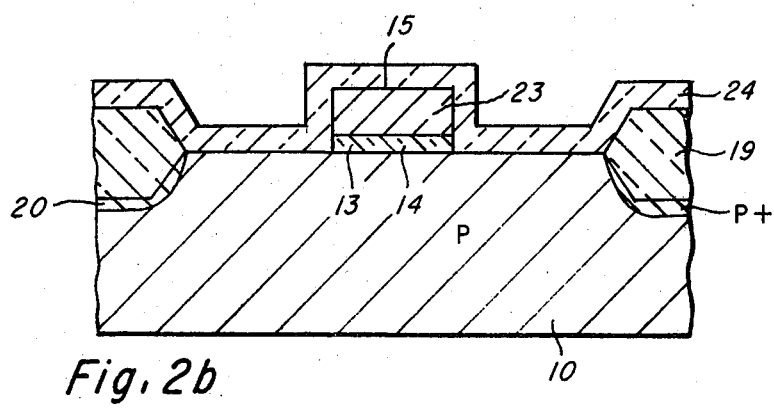
Figure 2C:
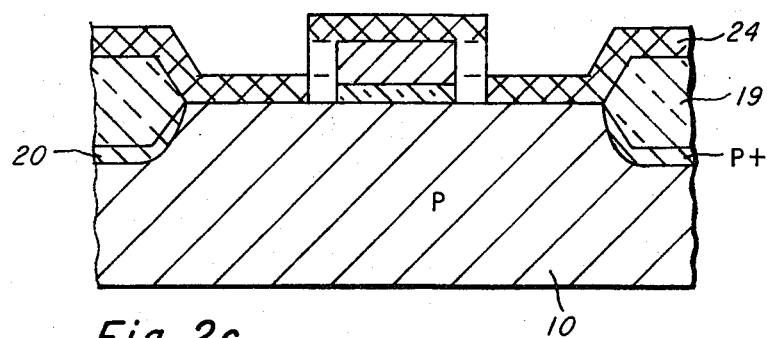
Figure 2D:
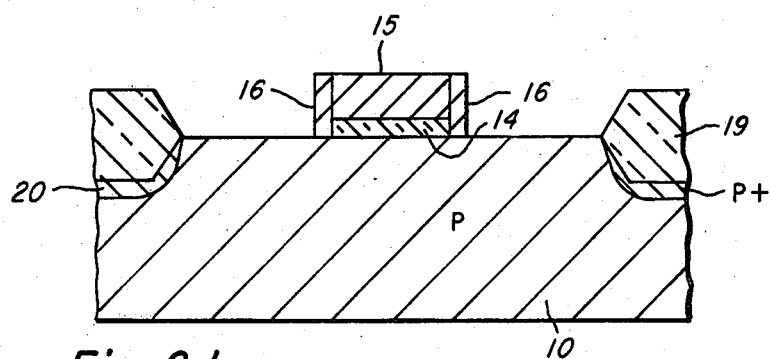

Referring to FIGS. 1a and 2a–2e, a process for making the transistor of FIGS. 1a–1b is described. The starting material is a p-type monocrystalline silicon substrate 10. A thin layer of silicon dioxide is grown upon the substrate 10 followed by the deposition of a silicon nitride layer. The oxide and nitride layers are patterned using well known photolithographic techniques leaving silicon 10 exposed in areas where the channel stoppers 20 and thick field oxide areas 19 are to be formed. The slices are subjected to a boron implant at a dose of $10^{12}$–$10^{13}$ ions/cm$^2$ at 40–100 KeV followed by along oxidation at 900° C. to form the channel stopper regions 20 and the thick field oxide 19. The thick field oxide 19 is 6000–10,000A thick. The nitride and thin oxide layers are then removed followed by the growth of a thin oxide layer 13 which leaves the slice as shown in FIG. 2a. The thin oxide layer 13 is grown to a thickness of 100–1000A, preferably 400A, and part of this layer 13 will become the gate insulator 14. A layer 23 of polycrystalline silicon is deposited upon the thin oxide layer 13 to a thickness of 1000–6000A, preferably 4000A. The polycrystalline silicon layer 23 is patterned to form the gate electrode 15. It is important here to have the edges of the gate electrode 15 as vertical as possible for reasons to be explained later. Plasma and reactive ion etching techniques for producing substantially vertical edges have been reported in the literature. Examples are, "Reactive ion etching of silicon", by Schwartz and Schaible, J. Vac. Sci. Technol., 16 (2) Mar./Apr. 1979, pp. 410–413, and "Applications of Reactive Plasma Practical Microelectronic Processing Systems", by Maddox and Parker, Solid State Technology, April 1978, pp. 107–113. Commercial machines for performing such etching are also available. A layer 24 of silicon dioxide is deposited upon the slice to a thickness of 1000–5000A, preferably 3000A by low pressure chemical vapor deposition (hot wall reactor) leaving the slice as shown in FIG. 2b. Parts of this layer 24 will form the pair of insulating regions 16 at the edge of the gate electrode 15. The entire slice is then subjected to an argon implant which is perpendicular to the surface of the slice. The argon implant is at a dose of $\geq 10^{14}$ ions/cm$^2$. The beam voltage depends on the type and thickness of the insulating layer 24. The cross hatched area in FIG. 2c shows the extent to which the argon implant has penetrated the deposited oxide layer 24. The slices are then subjected to a hydrofluoric acid etch solution which removes the implanted areas of the deposited oxide layer 24 at a much higher rate than it removes the unimplanted areas. After etch, the slice is shown as in FIG. 2d. Note that the pair of insulating regions 16 is thinner now than before the etch. After etch, the insulating regions 16 are 400–2000A thick, depending on the original thickness of the deposited oxide layer 24.

From examining FIG. 2c, it can be understood why it is important to have the edges of the gate electrode 15 perpendicular to the surface of the slice. The argon implant is chosen to penetrate only the thickness of the deposited oxide layer 24. Consequently, the pair of insulating regions 16 is not exposed to the implant when the edges of the gate electrode 15 are perpendicular to the slice surface. This keeps the pair of insulating regions 16 as thick as possible because of the selective etching.

Figure 2E:
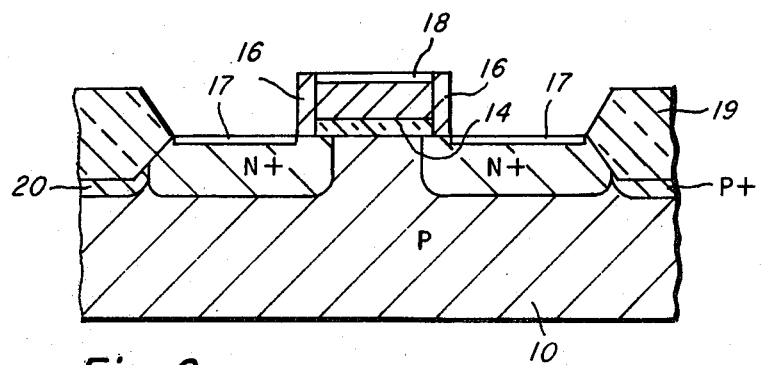

After etch, the slice is subjected to an arsenic implant to form the source 11 and drain 12. The arsenic implant is at a dose of $10^{14}$–$10^{16}$ ions/cm$^2$ at 60–100 KeV, preferably $5\times10^{14}$ ions/cm$^2$ at 80 KeV. After implant, the slice is annealed in an inert atmosphere at 900°–1000° C. to activate the implanted arsenic. The final junction depth of the source 11 and drain 12 is 1000–4000A. After the anneal, platinum is sputtered on the entire slice using well known techniques to a thickness of 100–1000A, preferably 300A. The slice is then annealed at 350°–650° C., preferably 500° C., for approximately 20 minutes in an inert atmosphere to form the platinum silicide regions 17, 18. Next, the slice is subjected to an aqua regia etch to remove the platinum from areas of the slice where platinum silicide was not formed. This leaves the slice as shown in FIG. 2e. An insulating layer 26 comprising silicon dioxide is then deposited upon the entire slice to a thickness of 1000–15,000A, preferably 8000A, and then patterned to form contacts. A layer of aluminum is evaporated to a thickness of 3000–12,000A, preferably 8000A, and patterned to form lead interconnects. The device is then annealed in an inert atmosphere thereby completing the processing steps.

In the drawings, an interface has been shown between the gate dielectric 14 and the insulating regions 16. In some embodiments, such as when the insulating regions 16 are formed by thermal oxidation of a polycrystalline silicon gate electrode 15, the interface may not be real. In that case, the gate dielectric 14 and the pair of insulating regions 16 would form one insulating layer with thick areas corresponding to the insulating regions 16 and a thin area corresponding to the gate dielectric 14.

Although a specific device and process have been described, it is not intended that the invention be so limited. For example, the substrate 10 could be n-type silicon or other semiconductors, and in that case the pair of doped regions 11, 12 would be p-type. The thin insulating layer 13 could be silicon nitride, titanium dioxide or other insulators or combinations of insulators. The conductive strip 15 could be tantalum, aluminum or other conductors although clearly no metal silicide region could be formed in the conductive strip 15 if tantalum or aluminum is used. The pair of insulating regions 16 could be silicon nitride or other suitable insulators. The formation of the layer 24 out of which the pair of insulating regions 16 will be formed has been by deposition techniques although it could be thermally grown silicon dioxide if the gate electrode 15 is polycrystalline silicon. The metal silicide regions could be molybdenum silicide, titanium silicide or other metal silicides. The deposition of the metal to form the silicide could be by sputtering, evaporation or other known methods depending on the metal used. The implant of layer 24 is not intended to be limited to argon as other ions may be used.

In another embodiment of the invention the metal silicide region in the gate electrode could be different from the metal silicide region in the source and drain. In particular the metal silicide region in the gate electrode could be $MoSi_2$, $WSi_2$, $TiSi_2$ or $TaSi_2$. The process used to make this embodiment would be substantially similar to that used for the other embodiment differing only in the following particulars. After the deposition of the polycrystalline silicon layer 23 titanium is evaporated upon the polycrystalline silicon 23 to a thickness of 1000–1500A, preferably 1200A. The slice is annealed at 700°–1000° C., preferably 900° C. for 30 minutes to form the titanium silicide. The titanium silicide region is 2000–3000A thick. The polycrystalline silicon/titanium layer is then patterned to form the gate electrode 15, and the remainder of the processing is as before.

One of the advantages of the invention is that the thicker oxide at the edges of the gate gives higher breakdown voltages between first and second level interconnections without having to increase the thickness of the insulating layer between first and second level interconnects. Alternatively, the thickness of the interconnect insulating layer can be reduced while maintaining sufficient breakdown voltage between the two levels of interconnects. Thinner insulating layers allow patterning of smaller geometries and consequently gives smaller devices. The breakdown voltage from gate to source and drain is also increased. Another more important advantage is that a deep ($\geq 5000A$) source and drain junction is not necessary for achieving a low sheet resistance in the source and drain. The low resistance is achieved by the use of the silicide so that the junction may be very shallow. Also, the amount of source and drain lateral diffusion beneath the gate electrode is less for a given junction depth by an amount equal to the thickness of an insulating region. This, of course, avoids punch through problems with smaller gate lengths and also reduces gate-to-source and gate-to-drain capacitance. Faster, higher density devices are the result. A further advantage is that the resistance of the polycrystalline silicon gate electrode is reduced substantially thereby lowering RC time constant associated with the gate electrode. This reduction serves to improve the speed of the device. An advantage in lowering the resistance of the gate electrode (and other polycrystalline silicon interconnections) is that thinner, narrower polycrystalline silicon can be used without adversely affecting the performance of the device. Thinner polycrystalline silicon layers make it easier to have good device surface topology and multilevel interconnect system devices. The narrow polycrystalline silicon allows higher density devices to be achieved. The major advantage of having metal silicide regions in the doped regions is that the doped regions may be used as interconnections even when they are made very long and narrow. This also improves device packing density. Also, the use of silicide provides for low contact resistance. Finally, the nature of the process and structure is such that the silicide is self-aligned to the gate, source, drain and thick field oxide.

What is claimed is:

1. A semiconductor device comprising:
   a semiconductor substrate having a first conductivity type;
   a source region and a drain region, each having a second conductivity type which is opposite to said first conductivity type, separately disposed within a surface of said substrate, said source and drain regions defining a channel region therebetween;
   a gate insulator layer on said channel region;
   a gate on said gate insulator layer, said gate including a top surface and sides;
   first and second insulating regions at the respective sides of said gate nearest said source and drain regions, said respective insulating regions each comprising a top surface which is approximately at the level of the top surface of said gate;
   first and second silicide regions, laterally extended atop said source region and said drain region respectively; and
   a thick oxide layer of substantially uniform thickness atop said gate and said insulating regions.

2. The device of claim 1, further comprising a third silicide region atop said gate.

3. The device of claim 1, wherein said gate oxide comprises silicon dioxide.

4. The device of claim 1, wherein said first and second silicide regions laterally abut said first and second insulating regions respectively.

* * * * *